United States Patent
Zha et al.

(10) Patent No.: US 12,094,854 B2
(45) Date of Patent: Sep. 17, 2024

(54) DISPLAY PANEL AND DISPLAY DEVICE

(71) Applicant: WUHAN CHINA STAR OPTOELECTRONICS TECHNOLOGY CO., LTD., Wuhan (CN)

(72) Inventors: Guowei Zha, Wuhan (CN); Jianfeng Yuan, Wuhan (CN); Zhifu Li, Wuhan (CN)

(*) Notice: Subject to any disclaimer, the term of this patent is extended or adjusted under 35 U.S.C. 154(b) by 954 days.

(21) Appl. No.: 16/972,638

(22) PCT Filed: Oct. 28, 2020

(86) PCT No.: PCT/CN2020/124451
§ 371 (c)(1),
(2) Date: Dec. 7, 2020

(87) PCT Pub. No.: WO2021/253703
PCT Pub. Date: Dec. 23, 2021

(65) Prior Publication Data
US 2022/0320050 A1    Oct. 6, 2022

(30) Foreign Application Priority Data
Jun. 16, 2020 (CN) .......................... 202010547126.6

(51) Int. Cl.
*H01L 25/075* (2006.01)
*G06V 40/13* (2022.01)
(Continued)

(52) U.S. Cl.
CPC ...... *H01L 25/0753* (2013.01); *G06V 40/1318* (2022.01)

(58) Field of Classification Search
CPC .............. H01L 25/0753; H01L 25/167; G06V 40/1318; G06V 40/1324; G06V 40/10;
(Continued)

(56) References Cited

U.S. PATENT DOCUMENTS

2019/0213379 A1* 7/2019 Zhao .................. G06V 40/1318
2019/0362672 A1 11/2019 Cui et al.
(Continued)

FOREIGN PATENT DOCUMENTS

CN 108153053 A 6/2018
CN 108806578 A 11/2018
(Continued)

OTHER PUBLICATIONS

Chinese Office Action issued in corresponding Chinese Patent Application No. 202010547126.6 dated Apr. 11, 2024, pp. 1-9.

*Primary Examiner* — Omar F Mojaddedi (57) ABSTRACT

The present application provides a display panel and a display device. The display panel includes a plurality of pixel units, wherein each of the pixel units includes a sub-pixel, the sub-pixel includes a first micro-LED chip, and in a top view, a gap is provided between adjacent ones of the first micro-LED chips; and a functional element disposed at the gap, wherein a function of the functional element is different from a display function of the sub-pixel, in order to improve integration of the display panel, increase an added value of the display panel, and save a space of the whole machine.

7 Claims, 7 Drawing Sheets

(51) Int. Cl.
  *G09F 9/33* (2006.01)
  *H01L 25/16* (2023.01)
(58) Field of Classification Search
  CPC .......... G06V 40/14; G06V 40/18; G09F 9/33; H01Q 1/22
  See application file for complete search history.

(56) References Cited

U.S. PATENT DOCUMENTS

2020/0020676 A1* 1/2020 Cok ...................... H01L 25/167
2021/0097252 A1* 4/2021 Lee .................... G06V 40/1329
2021/0327979 A1* 10/2021 Kamada ................ G06F 3/0421
2022/0285461 A1* 9/2022 Hatsumi ................ H10K 59/40
2022/0384401 A1* 12/2022 Bok ................... H01L 25/0753

FOREIGN PATENT DOCUMENTS

| CN | 109521605 A | 3/2019 |
| CN | 208570072 U | 3/2019 |
| CN | 208954536 U | 6/2019 |
| CN | 209562656 U | 10/2019 |
| CN | 110462557 A | 11/2019 |
| CN | 111025722 A | 4/2020 |
| CN | 111160287 A | 5/2020 |
| CN | 111627346 A | 9/2020 |
| CN | 111627952 A | 9/2020 |
| CN | 212276740 U | 1/2021 |

\* cited by examiner

DISPLAY PANEL AND DISPLAY DEVICE

BACKGROUND OF INVENTION

Field of Invention

The present application relates to the field display technology, and in particular to a display panel and a display device.

Description of Prior Art

The display panel of the prior art, such as a liquid crystal display (LCD) panel integrated with a plurality of functional elements such as fingerprint sensors, where a layer of fingerprint sensors is usually directly superposed on a layer of the display panel, which wastes a space design of the display panel and makes an added value of the display panel low.

SUMMARY OF INVENTION

The present application provides a display panel and a display device, which increase an added value of the display panel by rationally utilizing the non-display area between pixels.

On order to solve the above problems, the technical solutions provided by the present application are as follows:

An embodiment of the present application provides a display panel including a plurality of pixel units, wherein each of the pixel units includes a sub-pixel, the sub-pixel includes a first micro-LED chip, and in a top view, a gap is provided between adjacent ones of the first micro-LED chips; and a functional element disposed at the gap, wherein a function of the functional element is different from a display function of the sub-pixel.

In the display panel provided by an embodiment of the present application, lengths and widths of the first micro-LED chips range from 1 micrometer to 100 micrometers, and heights of the first micro-LED chips range from 1 micrometer to 20 micrometers.

In the display panel provided by an embodiment of the present application, the functional element includes a biometric unit, an antenna unit, an energy storage unit, a storage unit, a logic unit, a pressure detection unit, or a combination thereof.

In the display panel provided by an embodiment of the present application, the biometric unit includes a fingerprint identification unit, the fingerprint identification unit includes a fingerprint identification sensor, the display panel further includes an optical path element, the fingerprint identification sensor is disposed at the gap, and the optical path element is correspondingly disposed above the fingerprint identification sensor.

In the display panel provided by an embodiment of the present application, an area of the fingerprint identification sensor ranges from 10 square microns to 800 square microns.

In the display panel provided by an embodiment of the present application, a distance between the fingerprint identification sensor and each of the first micro-LED chips ranges from 1 micrometer to 10 micrometers.

In the display panel provided by an embodiment of the present application, the biometric unit includes a near-infrared light sensor and a second micro-LED chip, wherein the second micro-LED chip is configured to emit near-infrared light to provide the near-infrared light sensor with a light source, and the near-infrared light sensor and the second micro-LED chip are disposed together at the gap.

In the display panel provided by an embodiment of the present application, a size of the second micro-LED chip is smaller than a size of each of the first micro-LED chips.

In the display panel provided by an embodiment of the present application, the size of the second micro-LED chip is one half or one third of the size of each of the first micro-LED chips.

In the display panel provided by an embodiment of the present application, the functional element includes at least two sub-functional elements with different functions.

In the display panel provided by an embodiment of the present application, the at least two sub-functional elements are respectively disposed at different gaps in a same pixel unit.

In the display panel provided by an embodiment of the present application, the at least two sub-functional elements are disposed at a same gap in a same pixel unit.

In the display panel provided by an embodiment of the present application, the at least two sub-functional elements are disposed at gaps in different pixel units, respectively.

In the display panel provided by an embodiment of the present application, the at least two sub-functional elements include a biometric unit and an antenna unit, wherein the biometric unit is disposed at a gap in a row of the pixel units, and the antenna unit is disposed at a gap in another row of the pixel units.

In the display panel provided by an embodiment of the present application, the at least two sub-functional elements further include an energy storage unit and a storage unit.

In the display panel provided by an embodiment of the present application, the antenna unit is distributed in an antenna setting area, the biometric unit is distributed in a biometric setting area, the energy storage unit is distributed in an energy storage setting area, and the storage unit is distributed in a storage setting area, wherein the antenna setting area is located on opposite sides of the display panel, the energy storage setting area is located in an upper area of the display panel, the storage setting area is located in a lower area of the display panel, and the biometric setting area is located between the energy storage setting area and the storage setting area.

In the display panel provided by an embodiment of the present application, an area of the biometric setting area accounts for one-tenth to one-third of an area of the display panel.

In the display panel provided by an embodiment of the present application, the display panel further includes a driving backplane, and the first micro-LED chips are bonded to the driving backplane.

In the display panel provided by an embodiment of the present application, the driving backplane includes a driving circuit for driving the first micro-LED chips.

Another embodiment of the present application further provides a display device, which includes a display panel, and the display panel includes a plurality of pixel units, wherein each of the pixel units includes a sub-pixel, the sub-pixel includes a first micro-LED chip, and in a top view; a gap is provided between adjacent ones of the first micro-LED chips; and a functional element disposed at the gap, wherein a function of the functional element is different from a display function of the sub-pixel.

Beneficial effects of the present application are that: in the display panel and display device provided by the present application, a micro-LED chip of extremely small size is used as a basic sub-pixel, so that a certain function integration area is reserved in a space of the micro-LED sub-pixel for undertaking functional elements. The functional elements are set on the one hand to improve integration of the display panel, increase an added value of the display panel, save a space of the whole machine, and reduce a thickness of the display panel, while on the other hand to be more conducive to achieving a full screen and improving user's experience.

BRIEF DESCRIPTION OF DRAWINGS

In order to more clearly illustrate the embodiments or the technical solutions of the existing art, the drawings illustrating the embodiments or the existing art will be briefly described below. Obviously, the drawings in the following description merely illustrate some embodiments of the present invention. Other drawings may also be obtained by those skilled in the art according to these figures without paying creative work.

DETAILED DESCRIPTION OF PREFERRED EMBODIMENTS

The following description of the various embodiments is provided to illustrate the specific embodiments of the invention. Directional terms mentioned in the present invention, such as "vertical", "horizontal", "upper", "bottom", "pre", "post", "left", "right", "inside", "outside", "side", etc., only refer to the direction of the additional drawing. Therefore, the directional terminology used is for the purpose of illustration and understanding of the invention. In the drawings, structurally similar elements are denoted by the same reference numerals.

Figure 1:
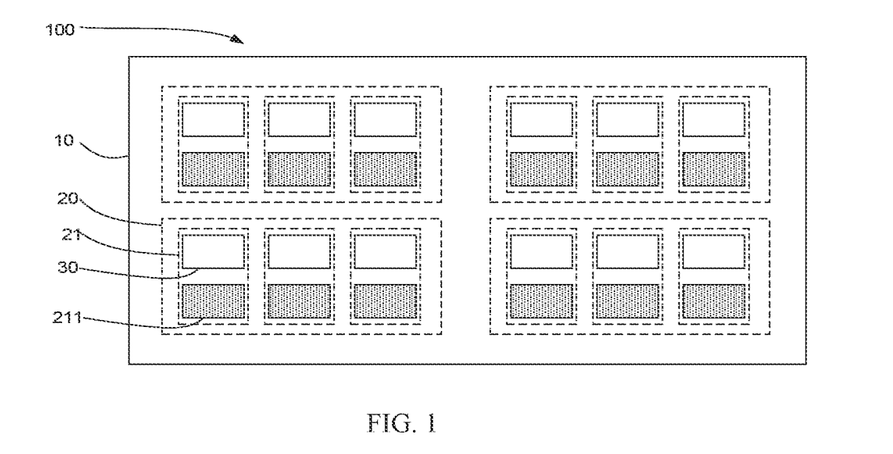
FIG. 1 is a schematic structural top view of a display panel provided by an embodiment of the present application.

In one embodiment, a display panel 100 is provided, as shown in FIG. 1, which includes a plurality of pixel units 20 and a functional element 30. Each of the pixel units 20 includes a sub-pixel 21, and the sub-pixel 21 includes a first micro-LED chip 211. A gap is provided between adjacent ones of the first micro-LED chips 211 in a top view. The functional element 30 is arranged at the gap. A function of the functional element 30 is different from a display function of the sub-pixel 21.

Specifically, the display panel 100 further includes a driving backplane 10. Each of the pixel units 20 includes three sub-pixels 21, and each of the sub-pixels 21 includes a first micro-LED chip 211, and the first micro-LED chips 211 are bound on the driving backplane 10. The functional element 30 is arranged on the driving backplane 10, and the functional element 30 is arranged in the gap between adjacent ones of the first micro-LED chips 211, that is, correspondingly arranged in an area of the pixel unit 20 where no first micro-LED chip 211 is provided.

Specifically, an area of each of the pixel units 20 where the first micro-LED chips 211 is provided is defined as a display area, and an area of each of the pixel units 20 where no first micro-LED chip 211 is provided is defined as a non-display area. That is, the gap between the adjacent ones of the first micro-LED chips 211 is the non-display area of the pixel unit 20. The functional element 30 is arranged in at least a part of the non-display area of the pixel unit 20. The functional element 30 includes a biometric unit, an antenna unit, an energy storage unit, a storage unit, a logic unit, and a pressure detection unit, or a combination thereof.

Further, each of the sub-pixels 21 emits light through the first micro-LED chip 211 to provide a pixel for display of the display panel, so as to realize the display function of the display panel. A function of the functional element is a non-display function, for example, the functional element is to realize a function such as fingerprint identification.

Specifically, the three first micro-LED chips 211 of each of the pixel units 20 are micro-LED chips of the three primary colors of red, green, and blue, respectively, and are used for display on the display panel. Of course, the three first micro-LED chips 211 of each of the pixel units 20 can also be micro-LED chips of the same color, and cooperate with quantum dot films or phosphors to display three primary colors.

It should be noted that the pixel units 20 of the present application is not limited to RGB (red, green, and blue) three primary colors for display, and may also be pixels of RGBW four primary colors (red, green, blue, and white). When pixels of the RGBW four primary colors are used, each of the pixel units includes four micro-LED chips.

Further, the first micro-LED chips 211 are transferred and bound to the driving backplane 10 through technologies such as mass transfer. The driving backplane 10 includes a driving circuit (not shown), and the driving circuit is configured to drive the first micro-LED chips 211. The driving circuit can be achieved by using active array driving technology or passive array driving technology based on amorphous silicon (α-Si), low temperature polysilicon (LTPS), indium gallium zinc oxide (IGZO), etc.

Figure 2:
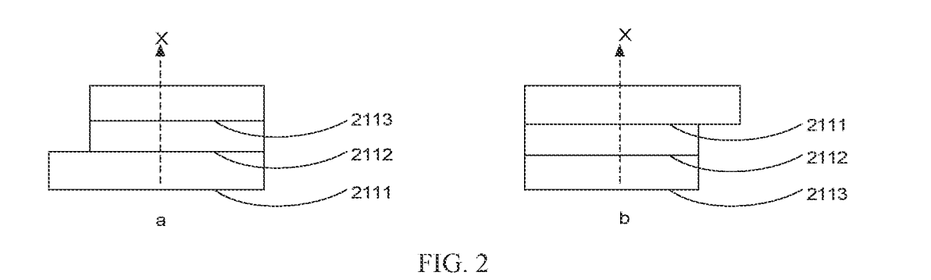
FIG. 2 is a schematic diagram of the light-emitting mode of a micro-LED chip provided by an embodiment of the present application.

Further, each of the first micro-LED chips 211 may be a substrate surface emission structure or an electrode surface emission structure. The first micro-LED chips structure shown in FIG. 2 includes a substrate 2111, a light-emitting layer 2112, and an electrode layer 2113. What designated by a in FIG. 2 is the electrode surface emission structure, and what designated by b in FIG. 2 is the substrate surface emission structure. A direction of the dotted line X with an arrow in FIG. 2 indicates the emission direction of light.

Further, the first micro-LED chip has a length and a width ranging from 1 micrometer to 100 micrometers, and a height ranging from 1 micrometer to 20 micrometers.

In this embodiment, at a specific pixel density, the pixel units of the display panel adopt very small-sized first micro-LED chips as the display units, so that the pixel units have enough non-display areas for setting functional elements. As such, integration of the display panel is improved, an added value of the display panel is improved, and a space of the whole machine is saved.

Figure 3:
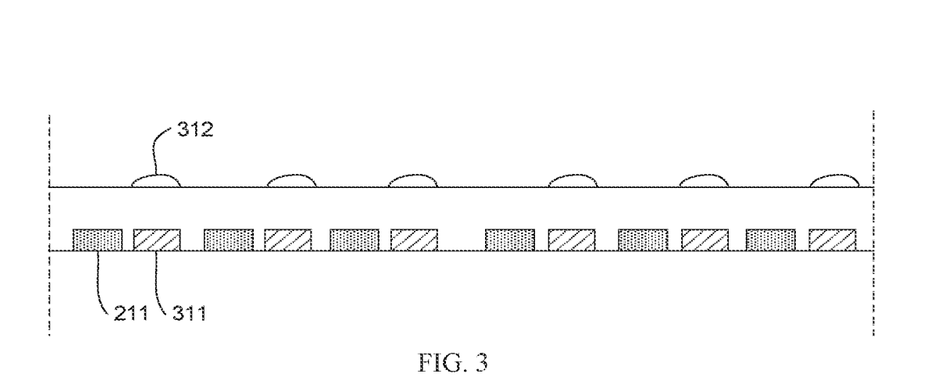
FIG. 3 is a schematic diagram of a display unit integrated with a fingerprint identification unit provided by an embodiment of the present application.

In an embodiment, the functional element is configured as a fingerprint identification unit in a biometric unit. As shown in FIG. 3, the fingerprint identification unit includes a fingerprint identification sensor 311, and the display panel further includes an optical path element 312. The fingerprint identification sensor 311 is disposed in the gap between the adjacent ones of the first micro-LED chips 211, and the optical path element 312 is disposed above the fingerprint identification sensor 311. The optical path elements 312 are in a one-to-one correspondence to the fingerprint identification sensors 311.

Specifically, the fingerprint identification sensors 311 may be arranged in the non-display areas of some or all of the pixel units. Or, the fingerprint identification sensors 311 are correspondingly disposed in the non-display areas of some or all of the sub-pixels (the non-display area of the sub-pixel refers to the area where no first micro-LED chip is disposed in the corresponding sub-pixel).

Figure 4:
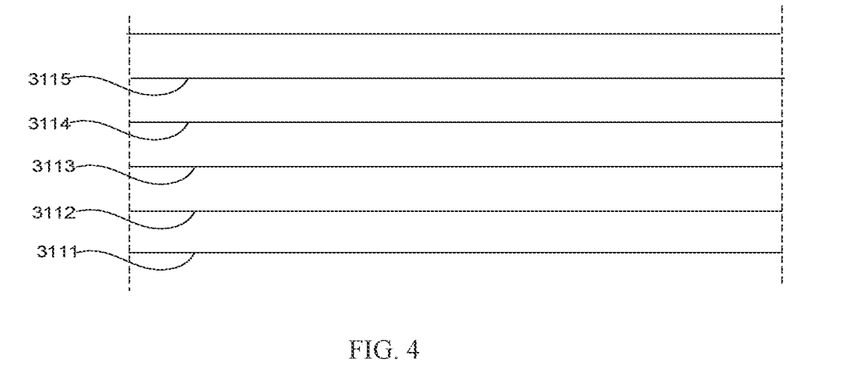
FIG. 4 is a schematic diagram of a PIN structure of a fingerprint identification sensor provided by an embodiment of the present application.

Specifically, the fingerprint identification sensor is implemented with a PIN structure such as α-Si, LTPS, organic photo diode (OPD) made of an organic material, etc. The fingerprint identification sensor PIN structure shown in FIG. 4 includes a cathode 3111, an electron transport layer 3112, an intrinsic active layer 3113, a hole transport layer 3114, and a anode 3115 which are stacked.

Further, an area of the fingerprint identification sensor ranges from 10 square microns to 800 square microns. Specifically, the area of the fingerprint identification sensor is jointly determined by photoelectric efficiency, optical path efficiency, circuit efficiency, light intensity, and circuit reading accuracy of the fingerprint identification sensor. A size of the fingerprint identification sensor is preferably able to meet the minimum area required for biointegration to reduce the impact on the display aperture ratio.

Further, a distance between the fingerprint identification sensor and the first micro-LED chips ranges from 1 micrometer to 10 micrometers. Specifically, a distance between the fingerprint identification sensor and the first micro-LED chips depends on a noise suppression efficiency of an optical path.

Further, the fingerprint identification unit further includes a driving circuit (not shown) for driving the fingerprint identification sensor 311. The driving circuit of the fingerprint identification sensor 311 is compatible with the backplane driving circuit structure for driving the first micro-LED chips 211.

Further, the driving circuit of the fingerprint identification sensor 311 may adopt an active or passive array driving mode, wherein the active array driving mode uses a voltage generated by the photo-generated current to amplify a photo-generated voltage of a biological signal, usually adopting a 3T (thin film transistor) or 4T driving architecture; and the passive array driving mode uses an integral of the photo-generated current generated by the fingerprint identification sensor within a certain period of time as a biometric signal, usually adopting 1T or 2T driving architecture.

Further, optical principles of collimating holes, micro lenses, etc. are used to realize the one-to-one correspondence between the optical path element 312 and the fingerprint identification sensor 311.

Further, the light emitted by the first micro-LED chips 211 is reflected by the fingerprint ridges and valleys to form different reflected light, and is recognized by the fingerprint identification sensor 311 through the optical path element 312 to form different bright and dark images.

Figure 5:
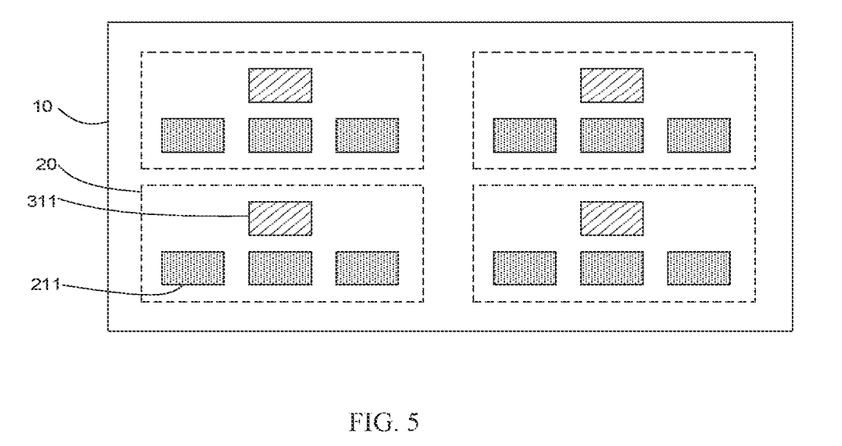
FIG. 5 and FIG. 6 are schematic diagrams of different arrangements of fingerprint identification sensors in the pixel units provided by embodiments of the present application.
Figure 6:
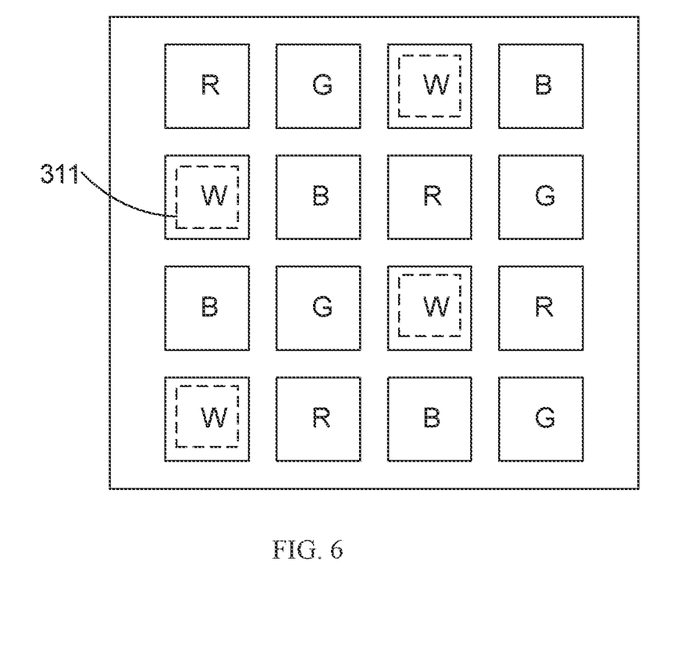

Further, the fingerprint identification sensor 311 and its driving circuit are usually opaque structures. In order to reduce the impact on display of the sub-pixel, the fingerprint identification sensor 311 is arranged between adjacent ones of the rows, that is, arranged in a gap between adjacent ones of the rows of sub-pixels. As shown in FIG. 5, the fingerprint identification sensor 311 is arranged in a gap between adjacent ones of the rows of first micro-LED chips 211. Of course, the display panel may also adopt a method based on a pixel of four primary colors such as RGBW to achieve an increase in transmittance, while adopting a method in which the fingerprint identification sensor 311 shares an opening area of the pixel with a W pixel, as shown in FIG. 6.

In this embodiment, the fingerprint identification unit is integrated in the non-display area of the pixel unit to achieve a full screen and improve the integration of the display panel, while reducing a thickness of the display panel and increasing an added value of the display panel, thereby realizing the fingerprint identification of a whole face, thus improving the user's experience.

Figure 7:
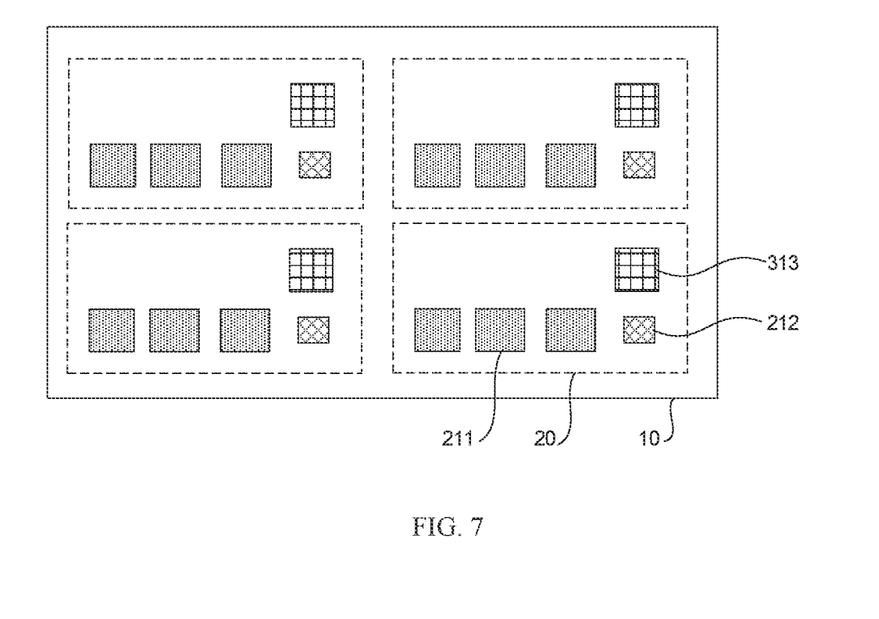
FIG. 7 is a schematic diagram of a display unit integrated with a palm vein identification unit according to an embodiment of the present application.

In one embodiment, a palm vein identification unit in the biometric unit is employed to serve as the functional element. As shown in FIG. 7, the biometric unit includes a near infrared light sensor 313 and a second micro-LED chip 212. The second micro-LED chip 212 is configured to emit near-infrared light to provide a light source for the near-infrared light sensor. The second micro-LED chip 212 and the near-infrared light sensor 313 are arranged together in the gap between the adjacent first micro-LED chips 211, and the second micro-LED chip 212 is also bound on the driving backplane 10. Further, the second micro-LED chip 212 and the near-infrared light sensor 313 are arranged together in the non-display area of the pixel unit 20, and the near-infrared light sensor 313 is arranged is an area where no second micro-LED chip 212 and no first micro-LED chip 211 is arranged. Specifically, the near-infrared light sensor 313 is correspondingly arranged in the pixel unit 20 provided with the second micro-LED chip 212.

Specifically, the size of the second micro-LED chip 212 is smaller than the size of the first micro-LED chip 211.

Specifically, the size of the second micro-LED chip 212 is one-half, one-third, or less of the size of the first micro-LED chip 211. It should be noted that the size of the second micro-LED chip 212 is not limited thereto, and the size of the second micro-LED chip 212 can be based on parameters such as photoelectric efficiency of the near infrared light sensor 313, light intensity of the second micro-LED chip. 212, and so on.

Figure 8:
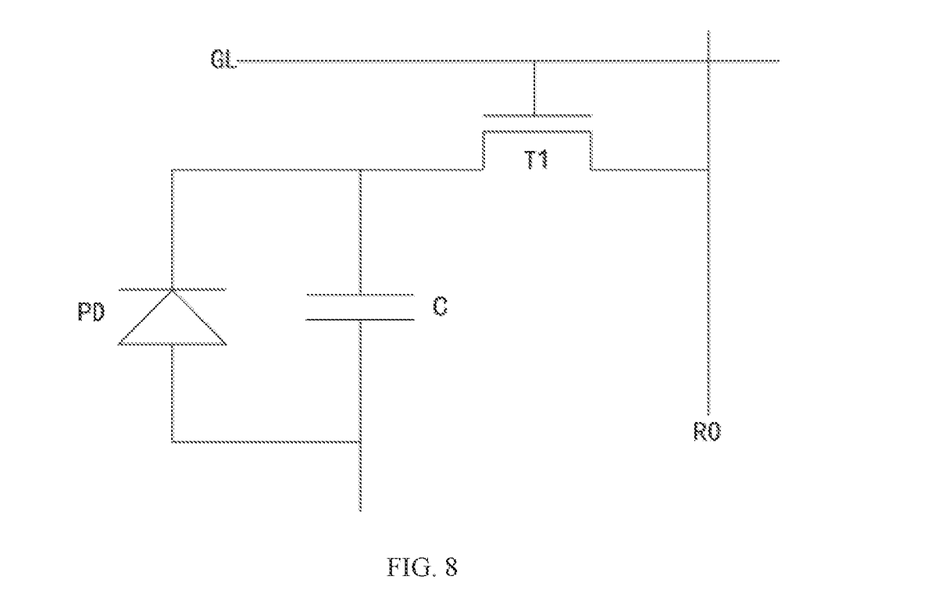
FIG. 8 is a schematic diagram of a driving circuit of a near-infrared light sensor provided by an embodiment of the present application.

Further, as shown in FIG. 8, the circuit structure of the near-infrared light sensor includes a near-infrared photo diode PD, a thin film transistor T1, and a storage capacitor C.

Specifically, the storage capacitor C is configured to accumulate the current generated by exposure of the near-infrared photo-generated current diode PD, and the thin film transistor T1 is configured to control the clearing of the storage capacitor C before exposure and the reading of data after exposure. Of course, the gate line GL in FIG. 8 needs to be connected to a timing control scanning circuit outside the display area, and a readout circuit ISO needs to be connected to an analog front end (AFE) circuit outside the display area for integration and filtering.

Further, the driving mode of the near-infrared light sensor 313 may be a passive array driving mode as shown in FIG. 8, or may adopt an active array driving mode with stronger driving capability.

It can be understood that, in order to reduce the impact on the sub-pixel display, arrangement of the near-infrared light sensor can refer to the arrangement of the fingerprint identification sensor in the above-mentioned embodiments, which will not be repeated herein for brevity.

In this embodiment, the palm vein identification unit is arranged in the non-display area of the pixel unit, and no additional near-infrared lamp illumination device is required, no optical lens is required, and no additional sensor is required to realize safe palm vein identification, such that the integration of the display panel is improved, the added value of the display panel is improved, and the function of the display is enriched.

It should be noted that the biometric unit of the present application is not limited to fingerprint identification and palm vein identification, but also includes camera, palmprint identification, iris identification, etc. When the biometric unit is used for ambient light detection or camera function, the sensor can be set to recognize the visible light band. When the biometric unit is used for fingerprint detection or palmprint detection, the sensor can be set to recognize the visible light band or near infrared light hand, such as 850 nanometers or 940 nanometers. When the biometric unit is used for ambient ultraviolet light detection, the sensor can be set to recognize the ultraviolet light band less than 380 nanometers.

Figure 9:
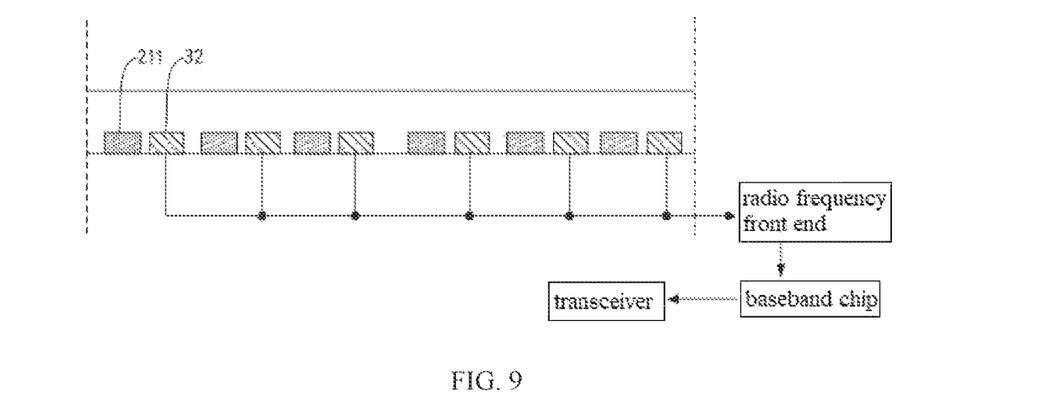
FIG. 9 is a schematic diagram of a display unit integrated with an antenna unit provided by an embodiment of the present application.

In an embodiment, an antenna unit is configured to serve as the functional element. The antenna unit is arranged in the non-display area of the pixel unit. As shown in FIG. 9, the antenna unit 32 is arranged in an area where no first micro-LED chip 211 is disposed, that is, in a gap between adjacent ones of the first micro-LED chips 211. The antenna unit 32 may be a communication antenna, such as a 2G/3G/4G/5G communication antenna, etc., an NFC antenna, a Bluetooth antenna, a WIFI antenna, or a combination thereof. The antenna unit 32 can realize a large-area array structure through an antenna arranged on a whole-surface. The array antenna unit 32 form a basic communication unit together with a peripheral radio frequency front end, a transceiver, and a baseband chip. The radio frequency front end includes a traditional structure such as a radio frequency switching structure, a radio frequency signal amplification structure, a filter, and a duplexer.

Specifically, taking a communication antenna as an example, the communication antenna may adopt a coplanar waveguide (slot-loop) architecture, a slot architecture, or a dipole antenna (dipole antenna) architecture.

Figure 10:
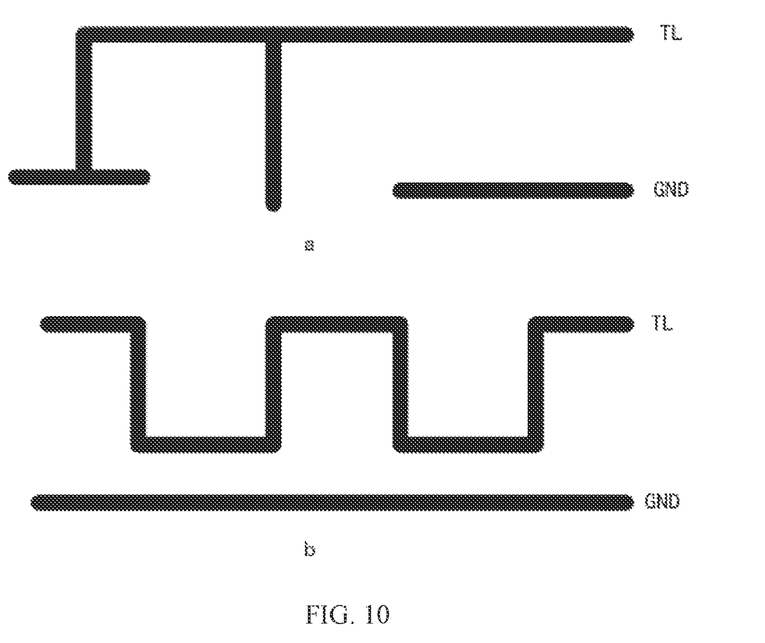
FIG. 10 is a schematic structural diagram of a Bluetooth antenna provided by an embodiment of the present application.

Specifically, taking a Bluetooth antenna as an example, the Bluetooth antenna can be designed as a typical inverted F-shaped or meander antenna. As shown in FIG. 10, the Bluetooth antenna structure includes an antenna TL and a ground line GND, where the element a in FIG. 10 is a typical inverted F-shaped antenna, and the element b in FIG. 10 is a meander antenna. The typical inverted F-shaped antenna and meandering antenna are both metal antenna structures on a surface of an insulator.

Further, when designing the antenna unit on a laminated structure of the substrate, in order to avoid the signal interference between the antenna unit and the display pixel unit, the antenna unit needs to be designed to make way for the sub-pixel and its driving circuit, and a safety distance should be set according to electromagnetic signal interference regulations.

In this embodiment, the antenna unit is arranged in the non-display area of the pixel unit, which improves the integration of the display panel and increases the added value of the display panel. Meanwhile, a traditional antenna arranged at the back of the display screen are easily negatively affected by the electromagnetic shielding interference of driving lines for display and touch control of the display screen. A coplanar structure of the display unit and the antenna unit of the present application can alleviate the signal shielding problem of coexistence of a plurality of antennas in the era of large-capacity communication.

Figure 11:
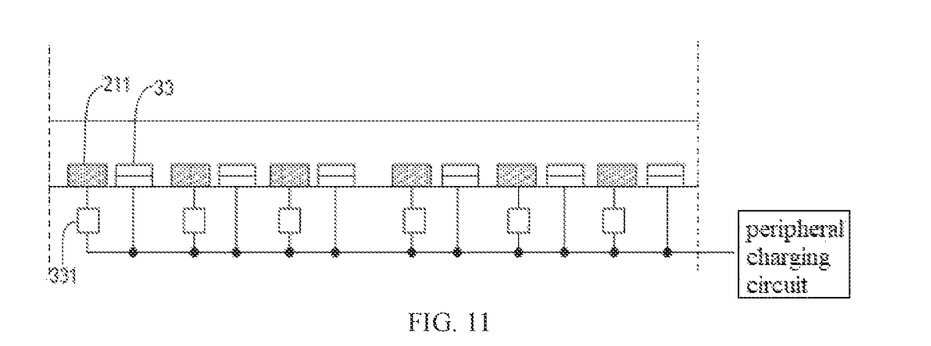
FIG. 11 is a schematic diagram of a display unit integrated with an energy storage unit provided by an embodiment of the present application.

In an embodiment, an energy storage unit is configured to serve as the functional element, and the energy storage unit is arranged in a non-display area of the pixel unit. Specifically, as shown in FIG. 11, the energy storage unit 33 is arranged in an area where no first micro-LED chip 211 is disposed, that is, in a gap between adjacent ones of the first micro-LED chips 211. The energy storage unit 33 may be a capacitive energy storage unit or the like.

Specifically, the capacitive energy storage unit includes electrode plates and a dielectric layer arranged between the electrode plates. The electrode plate can be a single-layered or multi-layered flat capacitor structure. A material of the dielectric layer includes an inorganic material such as silicon nitride ($SiN_x$) and silicon oxide ($SiO_x$), or a ceramic material such as barium titanate, strontium titanate, etc., or metal tantalum.

Further, the capacitive energy storage unit 33 is connected to a peripheral charging circuit through a corresponding circuit, and is charged synchronously when the pixel unit is energized and displayed. When the power is off, the capacitive energy storage unit 33 can reversely charge different sub-pixels in the pixel unit through a charge conversion unit 331, such that the first micro-LED chips 211 can work normally, thereby serving as an energy storage battery with a certain function and improving the endurance of the display system.

Further, in order to increase a size of the energy storage capacitor of the capacitive energy storage unit and avoid impact of the capacitance signal on the driving circuit of the sub-pixels, the capacitive energy storage unit is arranged in an area outside the sub-pixel and its driving circuit. In addition, the energy storage capacitor can have any arbitrary shape to maximize the size of the energy storage capacitor.

In this embodiment, the energy storage unit is arranged in the non-display area of the pixel unit, which improves the integration of the display panel and increases the added value of the display panel. Meanwhile, setting up an energy storage unit can improve the endurance of the display system.

Figure 12:
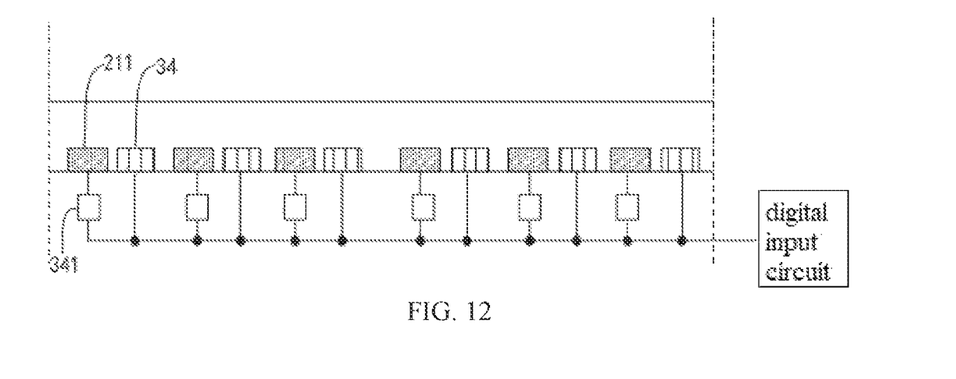
FIG. 12 is a schematic diagram of a display unit integrated with a storage unit provided by an embodiment of the present application.

In an embodiment, a storage unit is configured to serve as the functional element, and the storage unit is disposed in a non-display area of the pixel unit. As shown in FIG. 12, the storage unit 34 is arranged in an area where no first micro-LED chip 211 is disposed, that is, in a gap between adjacent ones of the first micro-LED chips 211.

Specifically, the storage unit 34 is interconnected with a peripheral digital input circuit, and the digital input circuit inputs digital storage signals to storage units in different sub-pixels or pixel units through row and column scan lines. The digital storage signal sends an instruction to execute an electrical signal to the current sub-pixel or pixel unit through a DAC conversion circuit 341 and other auxiliary circuits. Thus, the function of a single storage unit 34 to control a single sub-pixel or a pixel unit is realized, so that only when the current display pixel needs to be refreshed, an additional signal and power consumption are required to input an update signal to a specific sub-pixel or pixel unit.

In this embodiment, the storage unit is arranged in the non-display area of the pixel unit, which improves the integration of the display panel and increases the added value of the display panel. Meanwhile, setting up the storage unit is conductive to reducing overall logic power consumption, and can simplify the complexity of the digital input circuit, thereby achieving the effects of cost reduction and integration improvement.

It should be noted that the fingerprint identification unit, palm vein identification unit, antenna unit, energy storage unit, and storage unit in the above-mentioned embodiments merely exemplarily show the integration of some functional elements in the display panel, but the present application is not particularly limited thereto. Moreover, the fingerprint identification unit, palm vein identification unit, antenna unit, energy storage unit, and storage unit can be arranged in a plurality of pixel units or a plurality of sub-pixels, and the present application is not particularly limited to integrating one functional element on the display panel. The present application can also integrate a plurality of functional elements on the display panel at the same time.

Figure 13:
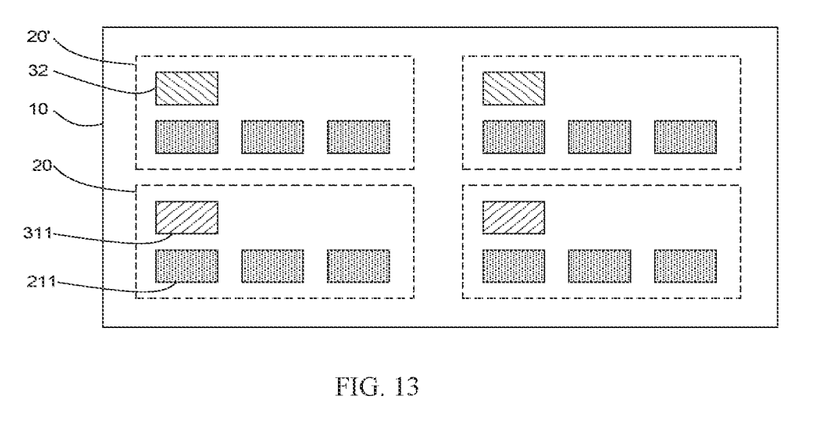
FIG. 13 is a schematic diagram of a display unit integrated with a fingerprint identification unit and an antenna unit according to an embodiment of the present application.

In an embodiment, the functional element includes at least two sub-functional elements with different functions. The at least two sub-functional elements are respectively arranged at the gaps in different pixel units. The at least two sub-functional elements include a biometric unit and an antenna unit.

Specifically, as shown in FIG. 13, the fingerprint sensor 311 of the fingerprint identification unit is arranged in the non-display area of one row of pixel units 20, and the antenna unit 32 is arranged in the non-display area of another row of pixel units 20'.

Further, in order to reduce the impact of the fingerprint identification sensor and the antenna unit on the sub-pixel display, the fingerprint identification sensor, and the antenna unit are designed to make way for the driving circuit of the sub-pixels.

Figure 14:
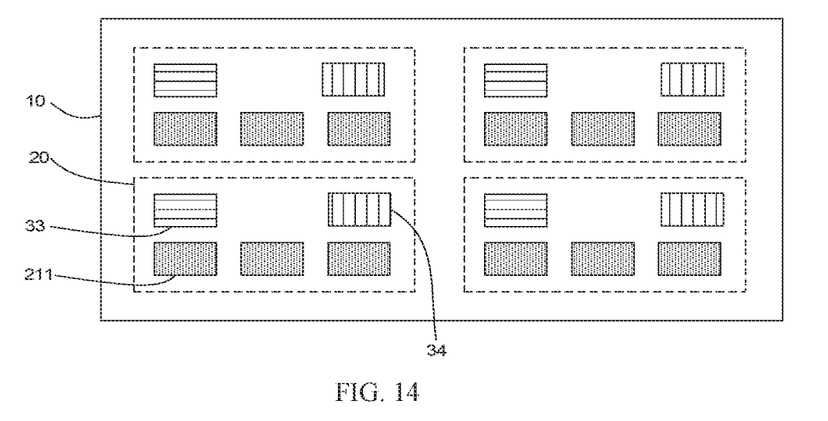
FIG. 14 is a first schematic diagram of a display unit integrated with an energy storage unit and a storage unit provided by an embodiment of the present application.

In an embodiment, the difference from the foregoing embodiment is that the at least two sub-functional elements are respectively arranged at different gaps in the same pixel unit, and the at least two sub-functional elements include an energy storage unit and a storage unit.

Specifically, as shown in FIG. 14, the energy storage unit 33 and the storage unit 34 are arranged in the non-display area of the same pixel unit 20, that is, at the gap between adjacent ones of the rows of first micro-LED chips 211. Specifically, the energy storage unit 33 and the storage unit 34 are arranged in some or all of the pixel units 20 where no first micro-LED chip 211 is provided, and the energy storage unit 33 and the storage unit 34 are spaced apart from each other.

Figure 15:
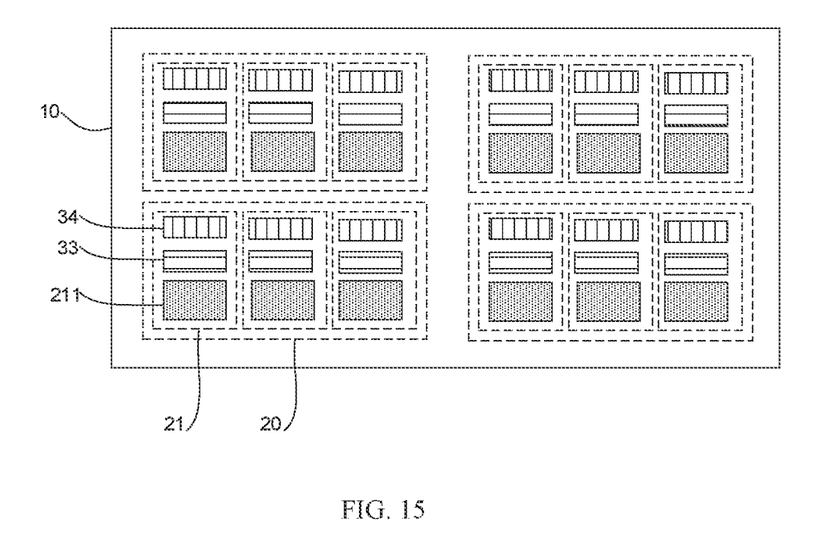
FIG. 15 is a second schematic diagram of a display unit integrated with an energy storage unit and a storage unit provided by an embodiment of the present application.

In an embodiment, the difference from the foregoing embodiments is that the at least two sub-functional elements are arranged at the same gap in the same pixel unit, and the at least two sub-functional elements include an energy storage unit and a storage unit.

Specifically, as shown in FIG. 15, the energy storage unit 33 and the storage unit 34 are arranged at the same gap in the same pixel unit 20. That is, they are arranged in the non-display area of the same sub-pixel 21. Further, the energy storage unit 33 and the storage unit 34 are arranged together in the gap between adjacent ones of the first micro-LED chips.

Specifically, each of the pixel units 20 includes three sub-pixels 21, and each of the sub-pixels 21 includes a first micro-LED chip 211. The energy storage unit 33 and the storage unit 34 are arranged in areas of some or all of the sub-pixels 21 where no first micro-LED chip 211 is provided.

It should be noted that the above embodiments exemplarily show combinations of the integration of some functional elements in the display panel, but the present application is not particularly limited thereto, and the present application may also be a combination of other functional elements or a combination of a plurality of functional elements.

Figure 16:
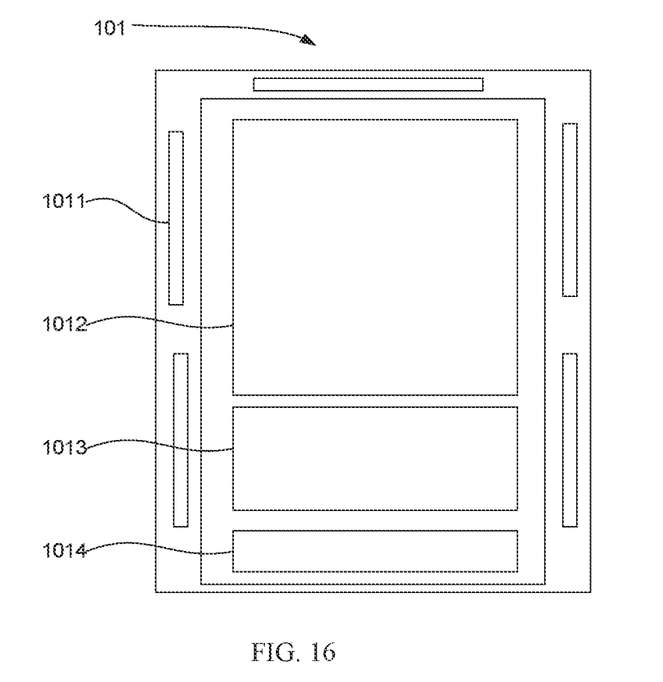
FIG. 16 is a schematic diagram of distribution when a plurality of functional elements provided by embodiments of the present application are integrated at the same time.

In an embodiment, the at least two sub-functional elements include a biometric unit, an antenna unit, an energy storage unit, and a storage unit. The biometric unit, the antenna unit, the energy storage unit, and the storage unit are simultaneously integrated in different gaps between adjacent ones of the first micro-LED chips. As shown in FIG. 16, the antenna unit is disposed in an antenna setting area 1011, and the antenna setting area 1011 is distributed on a left side, a right side, and an upper side of the display panel 101, so as to minimize the display opening area and omnidirectional radio frequency signal coverage. The energy storage unit is arranged in an energy storage setting area 1012, and the energy storage setting area 1012 is distributed in an upper area of the display panel 101. The storage unit is arranged in a storage setting area 1014, and the storage setting area 1014 is distributed in a space close to a position of a lower frame of the display panel 101, so that the conversion circuit signal of the storage unit can be electrically communicated to IC signals in a FPC or COF at the lower frame in the shortest path, thus achieving the purpose of reducing trace impedance. The biometric unit is illustrated by taking the fingerprint identification unit as an example. The fingerprint identification unit is set in a fingerprint identification setting area 1013, and the fingerprint identification setting area 1013 is located in an area between the energy storage setting area 1012 and the storage setting area 1014, For example, the fingerprint identification setting area 1013 may occupy one-tenth to one-third of an area of the entire display panel 101, and specifically, it can be one-fourth, which matches a common position of the finger identification area and large-area identification requirements. The energy storage setting area 1012 can occupy a larger area of the display panel 101 to achieve the requirement of maximizing the energy storage area.

Specifically, when a plurality of functional elements are integrated in the display panel, in order to ensure that the display pixels corresponding to different integrated functional element areas have obvious boundary mura, it is necessary to ensure that the sub-pixels in different areas have the same shape, size, or brightness. That is, the sizes of the sub-pixels in different areas depend on the sizes of the functional elements that most affects the aperture ratio. Even if no functional element is provided in a part of the area, sub-pixels of the same size as the areas where the functional elements are integrated need to be provided in this part of the area.

In one embodiment, a display device is provided, which includes the display panel according to one of the above embodiments.

According to the above embodiment, it can be known:

The present application provides a display panel and a display device. The display panel includes a driving backplane, and micro-LED chips and functional elements bound on the driving backplane. The functional elements are arranged in the gaps between adjacent ones of the first micro-LED chips. By adopting a micro-LED chip of extremely small size as a basic sub-pixel, a certain function integration area is reserved in a space of the micro-LED sub-pixel for undertaking functional elements. The functional elements include transmitting and sensing units such as communication antennas, biometrics, energy storage batteries, storage units, logic circuits, cameras, pressure detection, or combinations thereof. On the one hand, the functional elements improve integration of the display panel, increase an added value of the display panel, save a space of the whole machine, and reduce a thickness of the display panel, while on the other hand to be more conducive to achieving a full screen and improving user's experience. Moreover, the functional elements make full use of the space of the display panel, and the accommodating space increases with the increase of the modular display area, so that it can be adaptively adjusted to adapt to the display requirements. Meanwhile, the sufficient space of the display panel is full used, which is conducive to overcoming the limitations of adapting to logic circuits but not adapting to analog circuits, caused by excessively high integration of traditional silicon semiconductor processes, so that the display panel and the traditional semiconductor IC have their respective advantages in space and integration, thereby achieving an effect of complementary advantages.

While the invention has been described by way of example and in terms of the preferred embodiments, it is to be understood that the invention is not limited to the disclosed embodiments. To the contrary, it is intended to cover various modifications and similar arrangements. Therefore, the scope of the appended claims should be accorded the broadest interpretation so as to encompass all such modifications and similar arrangements.

What is claimed is:

1. A display panel, comprising:
a plurality of pixel units, wherein each of the pixel units comprises a sub-pixel, the sub-pixel comprises a first micro-LED chip, and in a top view, a gap is provided between adjacent ones of the first micro-LED chips; and
a functional element disposed at the gap,
wherein a function of the functional element is different from a display function of the sub-pixel,
wherein the functional element comprises a biometric unit, an antenna unit, an energy storage unit, a storage unit, a logic unit, a pressure detection unit, or a combination thereof,
wherein the biometric unit comprises a fingerprint identification unit, the fingerprint identification unit comprises a fingerprint identification sensor, the display panel further comprises an optical path element, the fingerprint identification sensor is disposed at the gap, and the optical path element is correspondingly disposed above the fingerprint identification sensor.

2. The display panel according to claim 1, wherein lengths and widths of the first micro-LED chips range from 1 micrometer to 100 micrometers, and heights of the first micro-LED chips range from 1 micrometer to 20 micrometers.

3. The display panel according to claim 1, wherein an area of the fingerprint identification sensor ranges from 10 square microns to 800 square microns.

4. The display panel according to claim 1, wherein a distance between the fingerprint identification sensor and each of the first micro-LED chips ranges from 1 micrometer to 10 micrometers.

5. The display panel according to claim 1, wherein the biometric unit comprises a near-infrared light sensor and a second micro-LED chip, wherein the second micro-LED chip is configured to emit near-infrared light to provide the near-infrared light sensor with a light source, and the near-infrared light sensor and the second micro-LED chip are disposed together at the gap.

6. The display panel according to claim 5, wherein a size of the second micro-LED chip is smaller than a size of each of the first micro-LED chips.

7. The display panel according to claim 6, wherein the size of the second micro-LED chip is one half or one third of the size of each of the first micro-LED chips.

\* \* \* \* \*